United States Patent
Aoshima et al.

(10) Patent No.: US 9,557,388 B2
(45) Date of Patent: Jan. 31, 2017

(54) BATTERY CONTROL DEVICE

(75) Inventors: Yoshinori Aoshima, Hitachinaka (JP);
Hiroshi Morikawa, Hitachinaka (JP);
Kenji Nakai, Hitachinaka (JP);
Keiichiro Ohkawa, Hitachinaka (JP)

(73) Assignee: HITACHI AUTOMOTIVE SYSTEMS, LTD., Ibaraki (JP)

( * ) Notice: Subject to any disclaimer, the term of this patent is extended or adjusted under 35 U.S.C. 154(b) by 131 days.

(21) Appl. No.: 14/403,330

(22) PCT Filed: May 24, 2012

(86) PCT No.: PCT/JP2012/063307
§ 371 (c)(1),
(2), (4) Date: Nov. 24, 2014

(87) PCT Pub. No.: WO2013/175606
PCT Pub. Date: Nov. 28, 2013

(65) Prior Publication Data
US 2015/0108991 A1    Apr. 23, 2015

(51) Int. Cl.
*G01N 27/416* (2006.01)
*G01R 31/36* (2006.01)
*H01M 10/42* (2006.01)

(52) U.S. Cl.
CPC ........ *G01R 31/3634* (2013.01); *G01R 31/3648* (2013.01); *G01R 31/3675* (2013.01); *G01R 31/362* (2013.01); *G01R 31/3658* (2013.01); *G01R 31/3662* (2013.01); *H01M 10/425* (2013.01)

(58) Field of Classification Search
CPC ............... G01R 19/16542; G01R 31/3631; G01R 31/3658; G01R 31/3682; Y02E 60/12

USPC ............................................... 324/430
See application file for complete search history.

(56) References Cited

U.S. PATENT DOCUMENTS

| 7,443,139 B2 | 10/2008 | Mitsui et al. | |
| 2002/0145430 A1* | 10/2002 | Arai | B60K 6/22 324/426 |
| 2007/0200567 A1 | 8/2007 | Mizuno et al. | |
| 2010/0185405 A1 | 7/2010 | Aoshima et al. | |
| 2010/0247988 A1* | 9/2010 | Okumura | B60K 6/445 429/90 |
| 2011/0234166 A1 | 9/2011 | Liu | |
| 2012/0274285 A1* | 11/2012 | Chawla | H01M 10/448 320/127 |

FOREIGN PATENT DOCUMENTS

| JP | 11-346444 A | 12/1999 |
| JP | 2002-189066 A | 7/2002 |
| JP | 2005-227164 A | 8/2005 |
| JP | 2006-338944 A | 12/2006 |
| JP | 2006-345634 A | 12/2006 |
| JP | 2010-221828 A | 10/2010 |
| WO | 2004/008166 A1 | 1/2004 |
| WO | 2011/155184 A1 | 12/2011 |

* cited by examiner

*Primary Examiner* — Arun Williams
(74) *Attorney, Agent, or Firm* — Volpe and Koenig, P.C.

(57) ABSTRACT

A battery control device calculates at least one of an allowable current and an allowable power during charge/discharge of a battery from a no-load voltage and an internal resistance of the battery, and corrects at least one of the no-load voltage and the internal resistance according to the states of charge/discharge of the battery.

8 Claims, 7 Drawing Sheets

BATTERY CONTROL DEVICE

TECHNICAL FIELD

The present invention relates to a battery control device.

BACKGROUND ART

Conventionally, there have been used batteries, such as a nickel-hydrogen storage battery and a lithium-ion storage battery, as a power supply source for driving an electric vehicle and a hybrid vehicle. In order to use those batteries safely, and without being deteriorated, a usable voltage range is previously set in the batteries. There is used a control device which obtains a maximum charge/discharge current of the battery without deviation from the voltage range and performs charge/discharge control of the battery based on the maximum charge/discharge current.

The following PTL 1 discloses a control device which obtains a maximum current during charge and controls charge of a power storage device. The control device obtains a battery voltage (a positive electrode potential and a negative electrode potential) during no-load based on a charge state (SOC: State Of Charge) of a battery as a power storage device, further obtains an internal resistance of the battery based on a temperature of the battery, and calculates a maximum current during charge using them.

CITATION LIST

Patent Literature

PTL 1: Japanese Patent Laid-Open Publication No. 2006-345634

SUMMARY OF INVENTION

Technical Problem

In the control device disclosed in PTL 1, the maximum current during charge is calculated from the battery voltage during no-load and the internal resistance. However, it has been known that those values are changed according to charge situations of a battery such as a temperature of the battery during charge, a charge time, and a charge current. In addition to during charge, this also applies to during discharge. In the control device of PTL 1, a current and an electric power allowed during charge/discharge cannot be accurately obtained while sufficiently reflecting changes of a no-load voltage and the internal resistance of the battery according to such charge/discharge situations.

In view of the above points, an object of the invention is to accurately obtain an electric current and an electric power allowed-during charge/discharge.

Solution to Problem

A battery control device according to present invention calculates at least one of an allowable current and an allowable power during charge/discharge of a battery from a no-load voltage and an internal resistance of the battery, wherein at least one of the no-load voltage and the internal resistance is corrected according to the situations of charge/discharge of the battery.

Advantageous Effects of Invention

According to a battery control device according to the present invention, an electric current and an electric power allowed during charge/discharge can be accurately obtained.

DESCRIPTION OF EMBODIMENTS

Hereinafter, an embodiment of the present invention will be described based on drawings. The embodiment to be described hereinafter can be applied to battery systems constituting power supplies of, for example, an electric vehicle (EV), a hybrid vehicle (HEV), and a plug-in hybrid vehicle (PHEV).

In a battery system to be described by the following embodiment, a lithium ion battery can be adopted, for example. In the following embodiment, although an assembled battery is configured by connecting battery cells in series, the assembled battery may be configured by connecting parallel-connected battery cells in series or by connecting series-connected battery cells in parallel.

Figure 1:
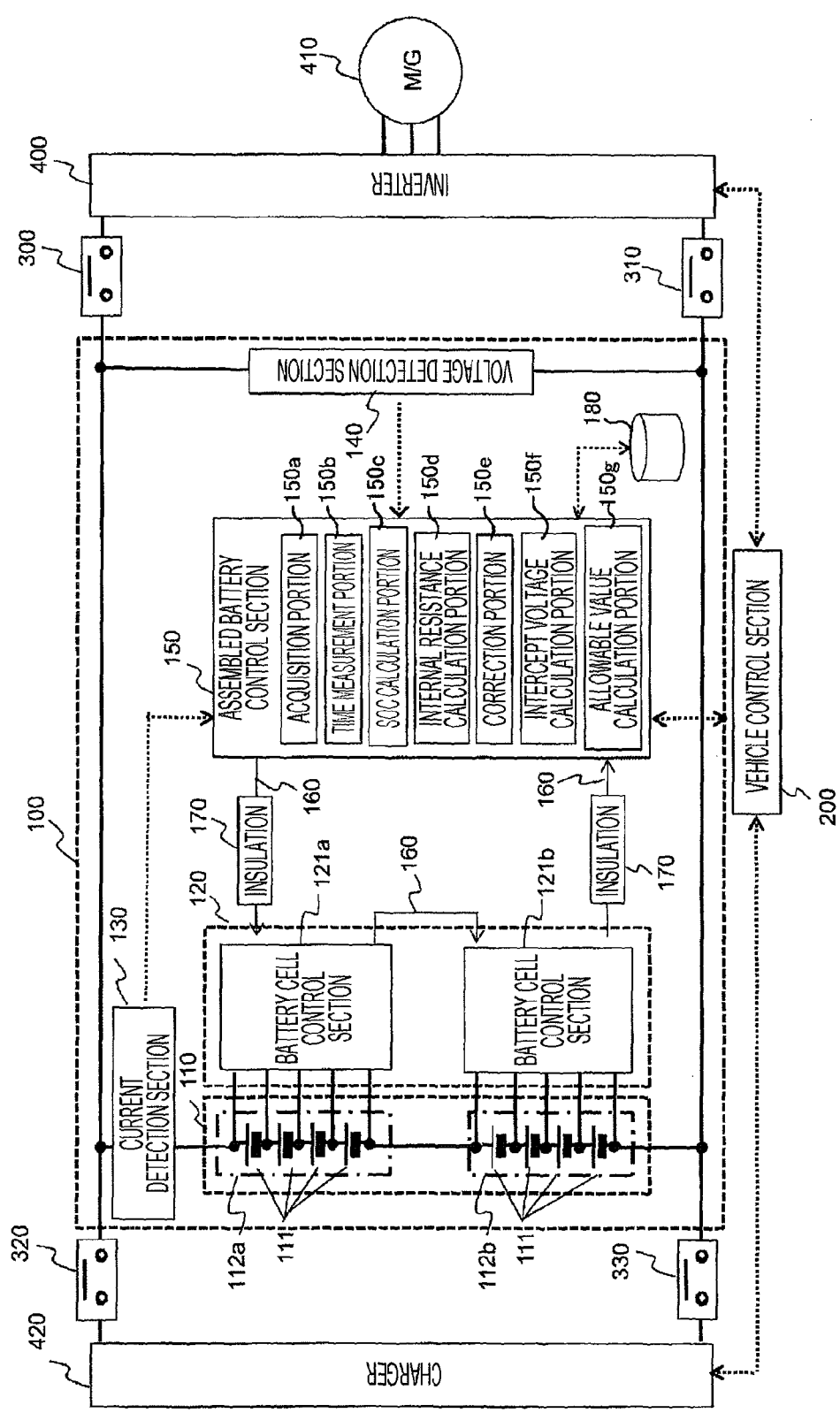
FIG. 1 is a block diagram showing a battery system equipped with a battery control device according to one embodiment of the present invention and configuration around the battery system.

FIG. 1 is a block diagram, showing a battery system 100 equipped with a battery control device according to one embodiment of the present invention and configuration around the battery system 100. The battery system 100 is connected to an inverter 400 through relays 300 and 310 and further connected to a charger 420 through relays 320 and 330. The battery system 100 is provided with an assembled battery 110, a battery cell management section 120, a current detection section 130, a voltage detection section 140, an assembled battery control section 150, and a storage section 180.

The assembled battery 110 is constituted of a plurality of battery cells 111. The battery cell management section 120 detects a battery voltage and a temperature of each of the battery cells 111, thereby monitors a state of each of the battery cells 111, and outputs the result to the assembled battery control section 150. The current detection section 130 detects a charge/discharge current flowing to the battery system 100 and outputs a detected current value to the assembled battery control section 150. The voltage detection section 140 detects a total voltage of the assembled battery 110 and outputs a detected voltage value to the assembled battery control section 150. The assembled battery control section 150 as a battery control device controls the assembled battery 110 based on them.

The assembled battery control section 150 is realized by a microcomputer and a memory, for example, and functionally has an acquisition portion 150a, a time measurement portion 150b, an SOC calculation portion 150c, an internal resistance calculation portion 150d, a correction portion 150e, an intercept voltage calculation portion 150f, and an allowable value calculation portion 150g.

The acquisition portion 150a obtains the information on the measurement results about the state of the assembled battery 110, as described above, from the battery cell management section 120, the current detection section 130, and the voltage detection section 140. Namely, the acquisition portion 150a receives the information on the battery voltage and the temperature of each of the battery cells 111 transmitted from the battery cell management section 120, the information on the charge/discharge current transmitted from the current detection section 130, and the information on the total voltage of the assembled battery 110 transmitted from the voltage detection section 140. In the following description, those information on the measurement results about the state of the assembled battery 110 obtained by the assembled battery control section 150 are collectively referred to as battery measurement information.

The time measurement portion 150b measures charge/discharge time of the assembled battery 110 using a timer built in the assembled battery control section 150. Namely, a time from start of charge to end of charge and a time from start of discharge to end of discharge are measured as the charge/discharge time.

The SOC calculation portion 150c calculates the charge state of the assembled battery 110, that is, SOC based on the above battery measurement information obtained by the acquisition portion 150a. For example, a variation of an electric power stored in the assembled battery 110 is obtained by integrating the charge/discharge current of the assembled battery 110, and the SOC can be calculated based on the variation.

The internal resistance calculation portion 150d calculates the internal resistance of the assembled battery 110 based on the temperature information on the battery measurement information obtained by the acquisition portion 150a and the SOC calculated by the SOC calculation portion 150c. The calculation of the internal resistance is performed by a method to be described in detail later, using map information of the internal resistance stored in the storage section 180.

The correction portion 150e corrects the internal resistance of the assembled battery 110 calculated by the internal resistance calculation portion 150d. The correction of the internal resistance is performed by a method to be described later, based on the charge/discharge time measured by the time measurement portion 150b.

The intercept voltage calculation portion 150f calculates an intercept voltage to the assembled battery 110 based on the temperature information of the battery measurement information obtained by the acquisition portion 150a and the SOC calculated by the SOC calculation portion 150c. The intercept voltage is a voltage corresponding to when the charge/discharge current is 0 in a graph showing a relation between the charge/discharge current and the voltage of the assembled battery 110. The calculation of the intercept voltage is performed by a method to be described later, using the map information of the intercept voltage stored in the storage section 180.

The allowable value calculation portion 150g calculates an allowable vale (allowable charge/discharge current) of the charge/discharge current allowed in the assembled battery 110 based on the internal resistance corrected by the correction portion 150e and the intercept voltage calculated by the intercept voltage calculation portion 150f. The allowable value calculation portion 150g further calculates an allowable value (allowable charge/discharge power) of the charge/discharge power allowed in the assembled battery 110 based on the allowable charge/discharge current. Those calculated values are transmitted from the assembled battery control section 150 to the battery cell management section 120 and a vehicle control section 200 and used for control during charge/discharge.

The storage section 180 stores various information used in each of the above functions of the assembled battery control section 150 and is realized by using flash memory and the like. For example, the map information used when the internal resistance calculation portion 150d calculates the internal resistance and the map information used when the intercept voltage calculation portion 150f calculates the intercept voltage are stored in the storage section 180. The information stored in the storage section 180 is read out or rewritten according to necessary by the control of the assembled battery control section 150.

The assembled battery 110 is configured by series-connecting a plurality of the battery cells 111 which can store and release electrical energy (charge/discharge DC power). The battery cells 111 constituting the assembled battery 110 are grouped for each predetermined unit number, and state management and control are performed in the unit of group by battery cell management section 120. The respective groups of the battery cells 111 are electrically connected in series and constitute battery cell groups 112a and 112b. The number of the battery cells 111 constituting the battery cell group may be the same as the battery cell groups 112a and 112b or different from the battery cell groups 112a and 112b.

The battery cell management section 120 monitors the states of the battery cells 111 constituting the assembled battery 110. The battery cell management section 120 is provided with battery cell control sections 121a and 121b provided corresponding respectively to the battery cell groups 112a and 112b. The battery cell control sections 121a and 121b monitor and control the states of the battery cells 111 constituting the battery cell groups 112a and 112b.

In this embodiment, in order to simplify description, the four battery cells 111 are electrically connected in series to constitute the battery cell groups 112a and 112b, and, thus, to electrically connect the battery cell groups 112a and 112b in series, whereby the assembled battery 110 provided with the eight single batteries 111 in total is provided. However, each number of the battery cell groups and the battery cells constituting the assembled battery 110 is not limited thereto.

The assembled battery control section 150 and the battery cell management section 120 mutually transmit and receive a signal through an insulating element 170 and signal communication means 160 typified by a photocoupler.

Here, communication between the assembled battery control section 150 and the battery cell control section 121a and 121b constituting the battery cell management section 120 will be described. The battery cell control section 121a and 121b are connected in series in descending order of potential of the battery cell groups 112a and 112b monitored respectively by the battery cell control sections 121a and 121b. A signal transmitted from the assembled battery control section 150 to the battery cell management section 120 is input to the battery cell control section 121a through the signal communication means 160 and the insulating element 170. The output of the battery cell control section 121a is input to the battery cell control section 121b through the signal communication means 160, and the output of the lowest-order battery cell control section 121b is transmitted to the assembled battery control section 150 through the insulating element 170 and the signal communication means 160. In this embodiment, although the insulating element 170 is not interposed between the battery cell control section 121a and the battery cell control section 121b, a signal can be transmitted and received through the insulating element 170.

The vehicle control section 200 controls the inverter 400 connected to the battery system 100 through the relays 300 and 310, using the information transmitted by the assembled battery control section 150. The vehicle control section 200 further controls the charger 420 connected to the battery system 100 through the relays 320 and 330.

The charger 420 is used when the assembled battery 110 is charged using an ordinary home power supply or a charging facility installed at public facilities. In this embodiment, although the charger 420 is configured to control the charge voltage, the charge current, and the like based on instructions from the vehicle control section 200, these controls may be performed based on instructions from the assembled battery control section 150. The charger 420, may be installed inside or outside a vehicle according to configuration of a vehicle, performance of the charger 420, the purpose of use, installation conditions of an external power supply.

When a vehicle loaded with the battery system 100 runs, the battery system 100 is connected to the inverter 400 through the relays 300 and 310 under management of the vehicle control section 200. At this time, a motor generator 410 is driven by the control of the inverter 400, using the energy stored in the assembled battery 110. In the regeneration, the assembled battery 110 is charged by the power generated by the motor generator 410.

Meanwhile, when a vehicle provided with the battery system 100 is connected to an ordinary home power supply or a charging facility installed at public facilities, the battery system 100 is connected to the charger 420 through the relays 320 and 330 based on the information transmitted by the vehicle control section 200. At this time, the assembled battery 110 is charged until a predetermined condition is satisfied. The energy stored in the assembled battery 110 by charge is used when the vehicle runs next time and also used for operating electric components inside and outside the vehicle. Further, according to need, the energy may be released to an external power supply typified by a household power supply.

Figure 2:
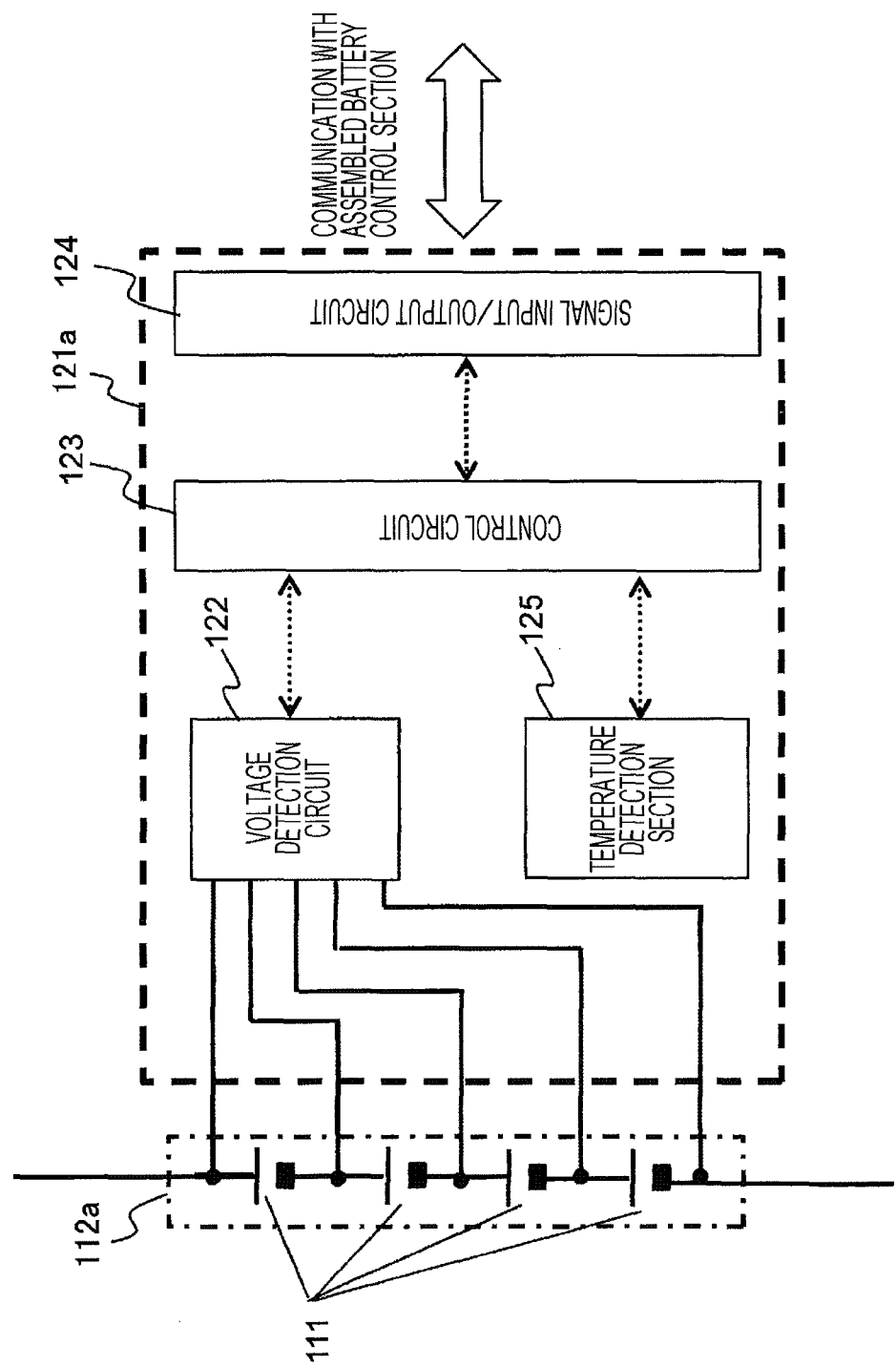
FIG. 2 is a block diagram showing a circuit configuration of a battery cell control section.

FIG. 2 is a block diagram showing a circuit configuration of the battery cell control section 121a. The battery cell control section 121a and the battery cell control section 121b basically have the same circuit configuration. Thus, hereinafter, the battery cell control section 121a will be described as a typical example.

The battery cell control section 121a is provided with a voltage detection circuit 122, a control circuit 123, a signal input/output circuit 124, and a temperature detection portion 125. Although omitted in FIG. 2, a common balancing circuit and the like for equalizing variation of the battery voltage and the SOC occurring between the battery cells 111 may be further provided in the battery cell control section 121a.

The voltage detection circuit 122 measures an inter-terminal voltage of each of the battery cells 111 and thereby measures the battery voltage of each of the battery cells 111. The temperature detection portion 125 measures the temperature of the entire battery cell group 112a, and the temperature is handled as the temperature of each of the battery cells ill constituting the battery cell group 112a, whereby the temperature of each of the battery cells 111 is measured. The control circuit 123 receives those measurement results from the voltage detection circuit 122 and the temperature detection portion 125 and transmits the measurement results to the assembled battery control section 150 through the signal input/output circuit 124.

In the battery cell group 112a as a temperature measurement object, a temperature sensor is installed. The temperature detection portion 125 detects a voltage corresponding to the temperature of the battery cell group 112a output from the temperature sensor and thereby measures the temperature of the battery cell group 112a, that is, the temperature of each of the battery cells 111. The measurement result is transmitted from the temperature detection portion 125 to the signal input/output circuit 124 through the control circuit 123 and output outside the battery cell control section 121a by the signal input/output circuit 124. A circuit for realizing the series of flow is mounted as the temperature detection portion 125 on the battery cell control section 121a. When the voltage output as temperature information of the battery cell group 112a from the temperature sensor is measured by the voltage detection circuit 122, the temperature detection portion 125 can be omitted.

The temperature detection portion 125 is provided for each of the battery cells 111, whereby the temperatures of the battery cells 111 are individually measured, and various calculations may be performed by the assembled battery control section 150 based on the measurement results. In this case, in comparison with the case where the temperature of the entire battery cell group 112a is measured as the temperature of each of the battery cells 111, as described above, the number of the temperature detection portions 125 is increased to lead to complexity of configuration of the battery cell control section 121.

Figure 3:
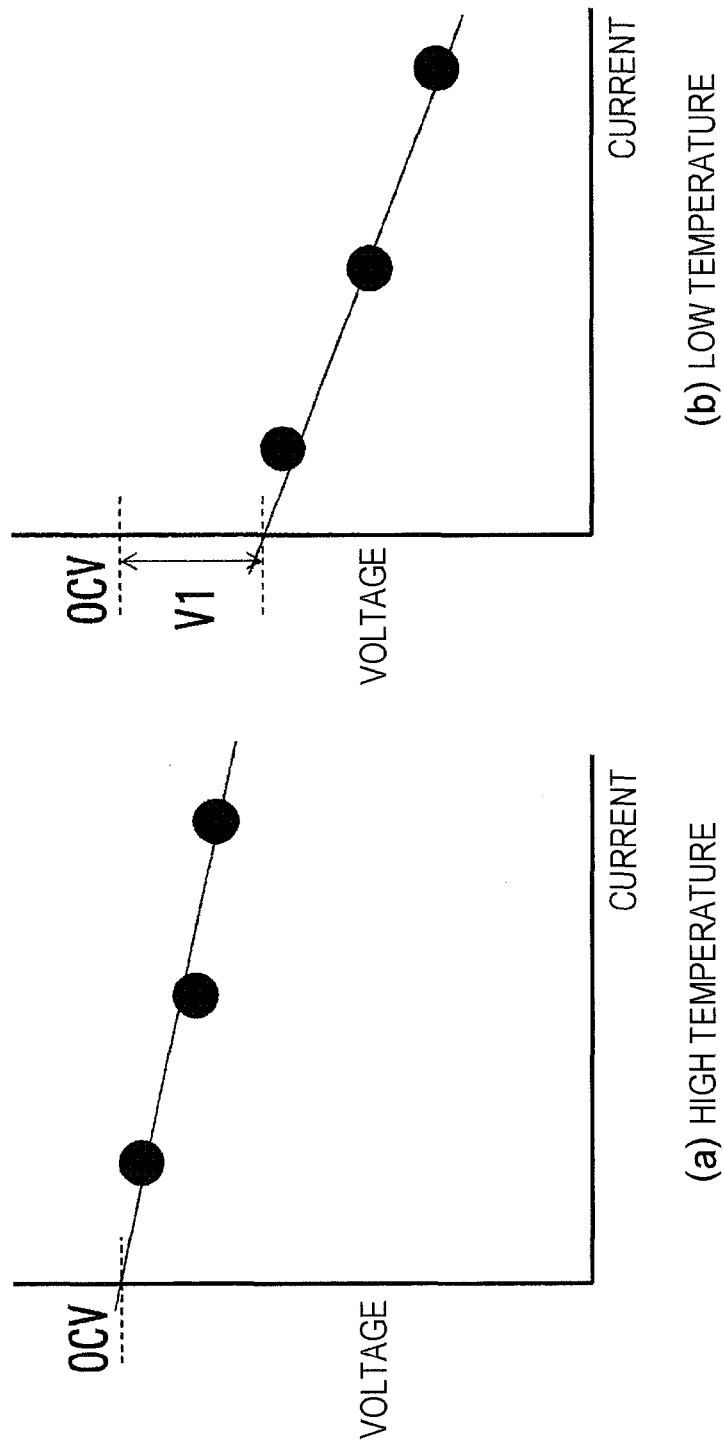
FIGS. 3(a) and 3(b) are views showing a graph for explaining a change of an intercept voltage during charge/discharge.

Next, the processing performed by the assembled battery control section 150 in the battery system 100 will be described. In conventional battery charge/discharge control, it was common to obtain the temperature and the SOC of a battery and determine the allowable charge/discharge current and the allowable charge/discharge power based on an internal resistance value of the battery estimated from the temperature and the SOC and an open circuit voltage (OCV) of the battery during no-load. The problems in this case will be described with reference to the following FIGS. 3 and 4.

FIGS. 3(a) and 3(b) show graphs for explaining a change of the intercept voltage during charge/discharge. The graph of FIG. 3(a) shows an example of a relation between the charge/discharge current and the battery voltage when the temperature of a battery is relatively high. As shown in the graph, at high temperature, as the charge/discharge current increases, the battery voltage drops at a constant rate according to the internal resistance. The intercept voltage caused when the charge/discharge current is 0 on the graph substantially corresponds to the OCV. Accordingly, in this case, the magnitude of current corresponding to a predetermined usable voltage range is obtained from the OCV and the internal resistance, whereby the allowable charge/discharge current and the allowable charge/discharge power can be determined.

The graph of FIG. 3(b) shows an example of a relation between the charge/discharge current and the battery voltage when the temperature of the battery is relatively low. As shown in this graph, at low temperature, as in the graph at high temperature shown in FIG. 3(a), as the charge/discharge current increases, the battery voltage drops at a constant rate according to the internal resistance. Since the internal resistance at low temperature is larger than that at high temperature, the gradient of the graph of FIG. 3(b) is larger than that of FIG. 3(a). Meanwhile, the intercept voltage caused when the charge/discharge current is 0 on the graph is different from the graph at high temperature shown in FIG. 3(a) and is lower by voltage V1 than the OCV. The voltage V1 fluctuates according to the temperature and the SOC of the battery, and as the temperature decreases, or as the SOC becomes high, the lowering width of the intercept voltage to the OCV is enlarged, and the voltage V1 increases. Accordingly, in this case, when the allowable charge/discharge current and the allowable charge/discharge power are determined using the OCV as it is, a value larger than actual value is obtained. As a result, the battery is held in an overcharge state or an overdischarge state, and this may cause lowering of safety and deterioration of the battery.

Figure 4:
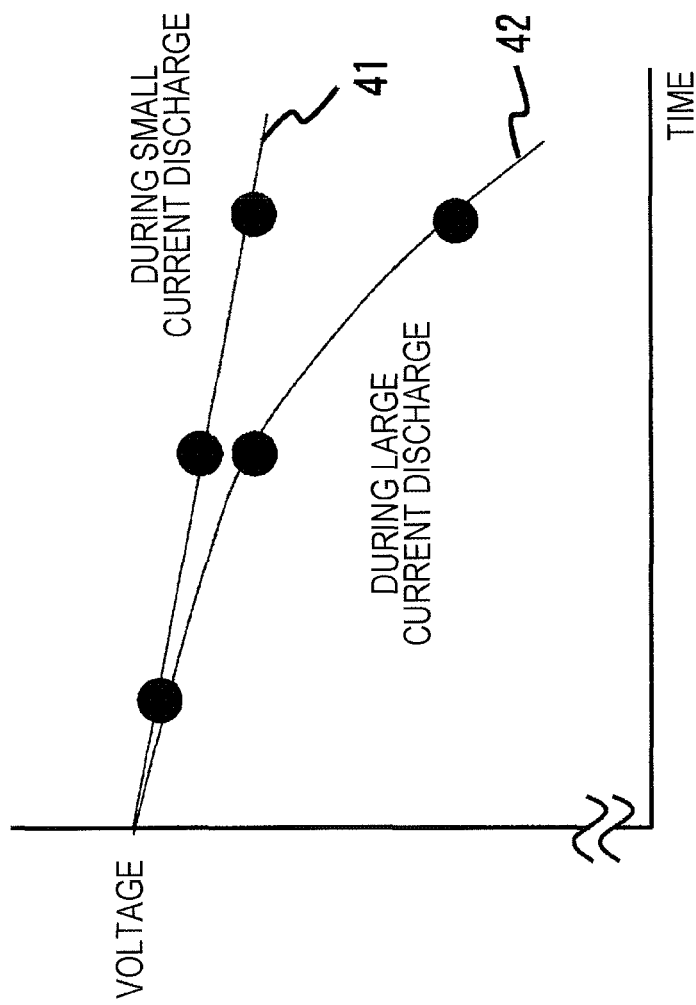
FIG. 4 is a view showing a graph for explaining a change of an internal resistance during charge/discharge.

FIG. 4 shows a graph for explaining a change of the internal resistance during charge/discharge. In FIG. 4, a graph 41 shows an example of a relation between the discharge time and the battery voltage when a battery is discharged with a relatively small constant discharge current. As shown in the graph 41, when the discharge current is small, as the SOC is reduced at a constant rate with the passage of the discharge time, the battery voltage is lowered at a constant rate. This represents that the internal resistance during discharge is constant. Accordingly, in this case, as in the case of FIG. 3(a), the magnitude of the current corresponding to a predetermined usable voltage range is obtained from the OCV and the internal resistance, whereby the allowable charge/discharge current and the allowable charge/discharge power can be determined.

In FIG. 4, a graph 42 represents an example of a relation between the discharge time and the battery voltage when a battery is discharged with a relatively large constant discharge current. As shown in the graph 42, when the discharge current is large, as SOC is reduced at a constant rate with the passage of the discharge time, the battery voltage is lowered at an accelerating pace. This represents that the internal resistance during discharge is not constant, and the internal resistance gradually increases as discharge progresses. Accordingly, in this case, when the allowable charge/discharge current and the allowable charge/discharge power are determined while setting the internal resistance as a constant value, a value larger than actual value is obtained as in the case of FIG. 3(b). As a result, the battery is held in the overcharge state or the overdischarge state, and this may cause lowering of safety and deterioration of the battery. In FIG. 4, although the example during discharge is shown, this also applies to during charge.

In order to solve the problems as described above, in the battery system 100 according to the present invention, the internal resistance and a no-load voltage of the assembled battery 110 calculated in the assembled battery control section 150 are corrected according to charge/discharge situations in consideration of the temperature, the charge/discharge time, the charge/discharge current of the assembled battery 110 during charge and discharge. Consequently, the allowable charge/discharge current and the allowable charge/discharge power can be accurately obtained.

Figure 5:
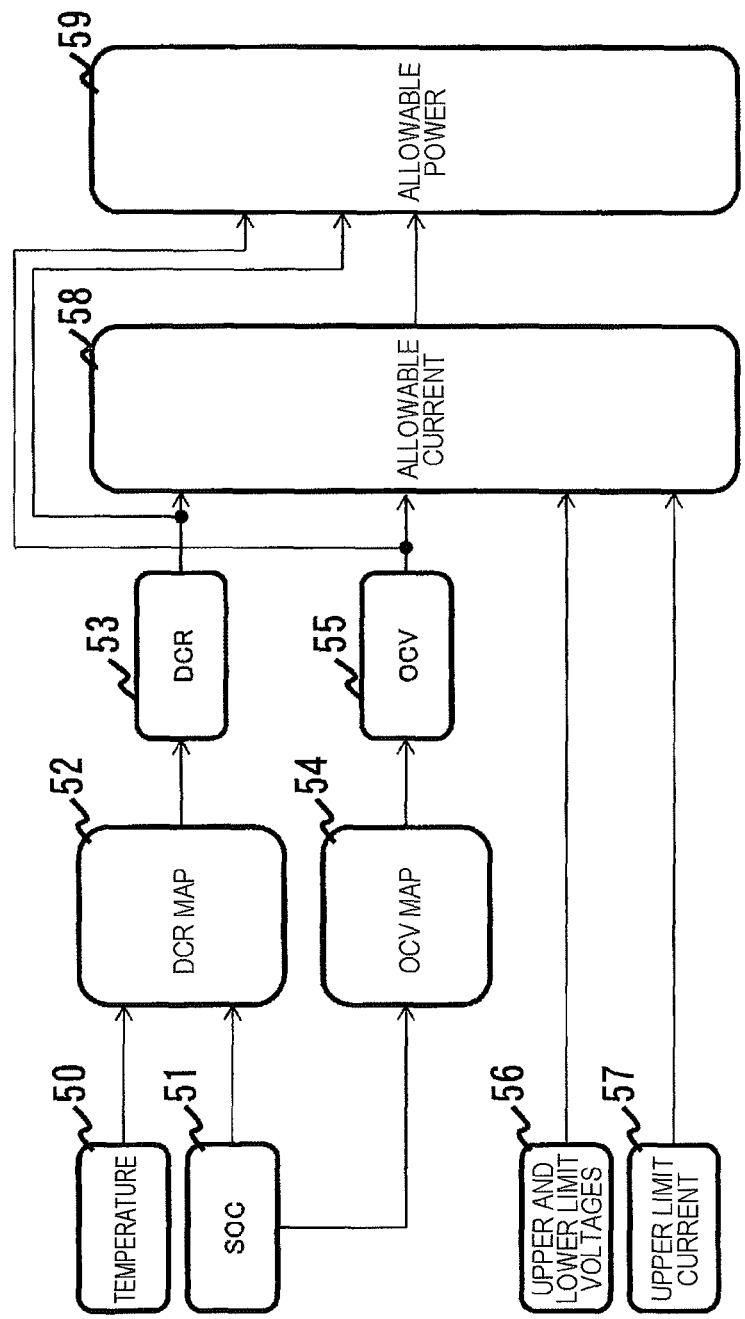
FIG. 5 is a control block diagram showing allowable value calculation processing according to conventional charge/discharge control.

FIG. 5 is a control block diagram showing the conventional allowable value calculation processing according to charge/discharge control as described above. In the conventional allowable value calculation processing according to charge/discharge control, in control blocks 50 and 51, the temperature and the SOC of the battery are obtained from the battery measurement information, and based on those values, previously stored map information (DCR map) of the internal resistance is referred in a control block 52. In the DCR map, a relation between the SOC and the internal resistance (DCR) for each temperature in a battery to be controlled is recorded, and the internal resistance of the battery can be obtained by referring to the recorded relation. In a control block 53, the internal resistance of the battery is calculated based on the reference result of the DCR map referred in the control block 52.

Meanwhile, in the control block 54, previously stored map information (OCV map) of the OCV is referred based on the SOC obtained in the control block 51. In the OCV map, a relation between the SOC and the OCV in a battery to be controlled is recorded, and the OCV of the battery can be obtained by referring to the recorded relation. In the control block 55, the OCV of the battery is calculated based on the reference result of the OCV map referred in the control block 52.

In control blocks 56 and 57, upper and lower limit voltages and an upper limit current of a battery, which are previously, set, are obtained. In a control block 58, based on those values and the internal resistance and the OCV calculated respectively in the control blocks 53 and 55, the allowable current of the battery during charge/discharge, that is, the allowable charge/discharge current is calculated. In a control block 59, the allowable power of the battery during charge/discharge, that is, the allowable charge/discharge power is calculated based on the calculation result of the allowable charge/discharge current calculated in the control block 58 and the internal resistance and the OCV calculated respectively in the control blocks 53 and 55.

Figure 6:
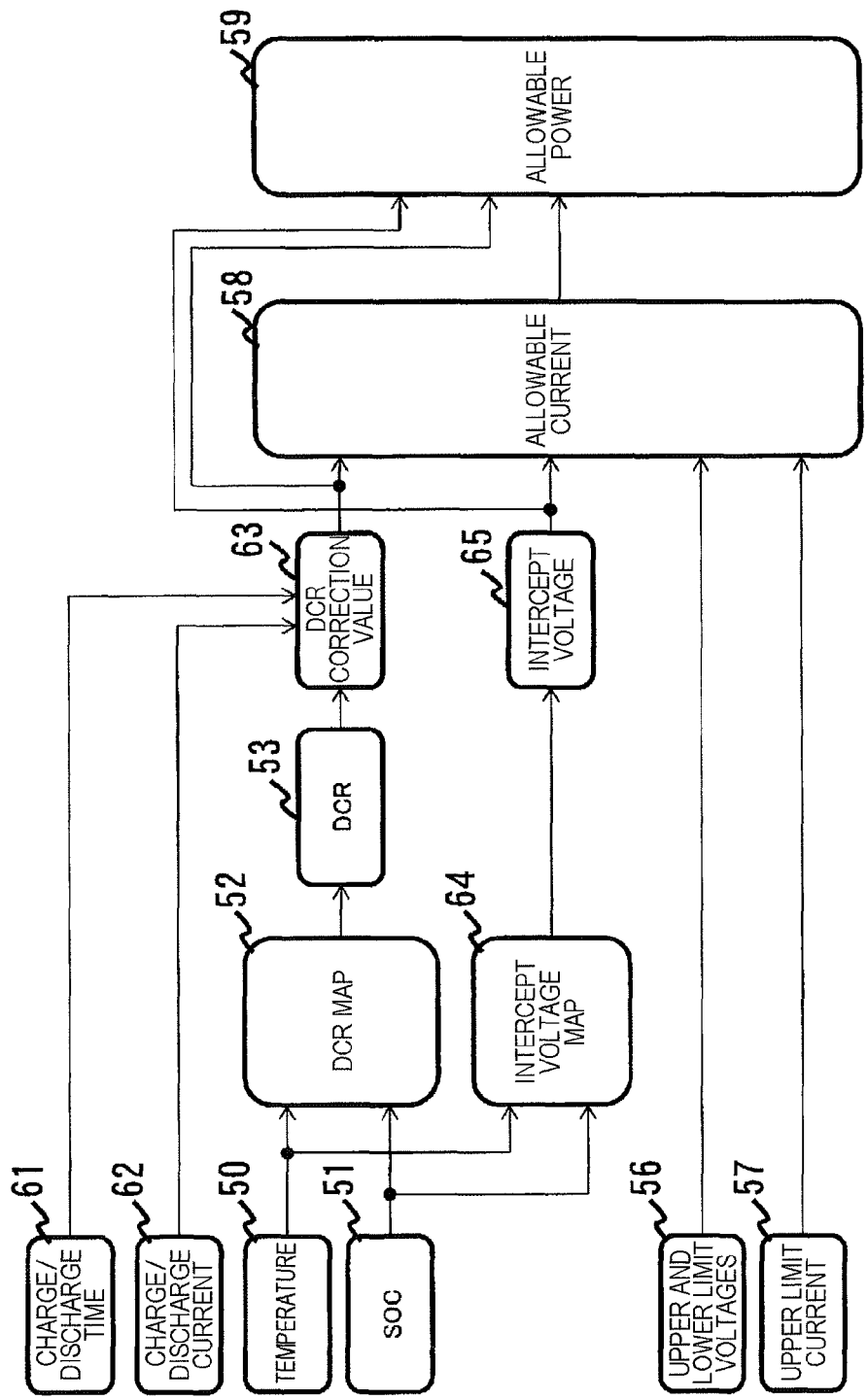
FIG. 6 is a control block diagram showing allowable value calculation processing according to charge/discharge control of the invention.

FIG. 6 is a control block diagram showing allowable value calculation processing according to charge/discharge control in the present invention. The control block diagram is different from the control block diagram of the conventional allowable value calculation processing according to charge/discharge control shown in FIG. 5 in that there are control blocks 61, 62, and 63, and the control blocks 54 and 55 are replaced with control blocks 64 and 65.

In the allowable value calculation processing according to the charge/discharge control in the present invention, in the control blocks 61 and 62, the charge/discharge time and the charge/discharge current of a battery are obtained, and based on those values, the internal resistance calculated in the control block 53 is corrected in the control block 63. In the control block 64, previously stored map information (intercept voltage map) of the intercept voltage is referred based on the temperature and the SOC obtained respectively in the control blocks 50 and 51. In the intercept voltage map, a relation between the charge/discharge time and the charge/discharge current in the battery to be controlled and the intercept voltage described in FIGS. 3(a) and 3(b) is recorded, and the intercept voltage as described above can be obtained by referring to this. In the control block 65, the intercept voltage of the battery is calculated based on the reference result of the intercept voltage map referred in the control block 64. By using the intercept voltage instead of the OCV, the no-load voltage of the battery is corrected from the OCV to the intercept voltage.

In the control blocks 58 and 59, based on the upper and lower limit voltages and the upper limit current obtained respectively in the control blocks 56 and 57, the internal resistance corrected in the control block 63, and the intercept voltage calculated instead of the OCV in the control block 65, the allowable current and the allowable power of a battery during charge/discharge are calculated. Consequently, the allowable charge/discharge current and the allowable charge/discharge power corresponding to the charge and discharge situations of the battery are calculated.

Figure 7:
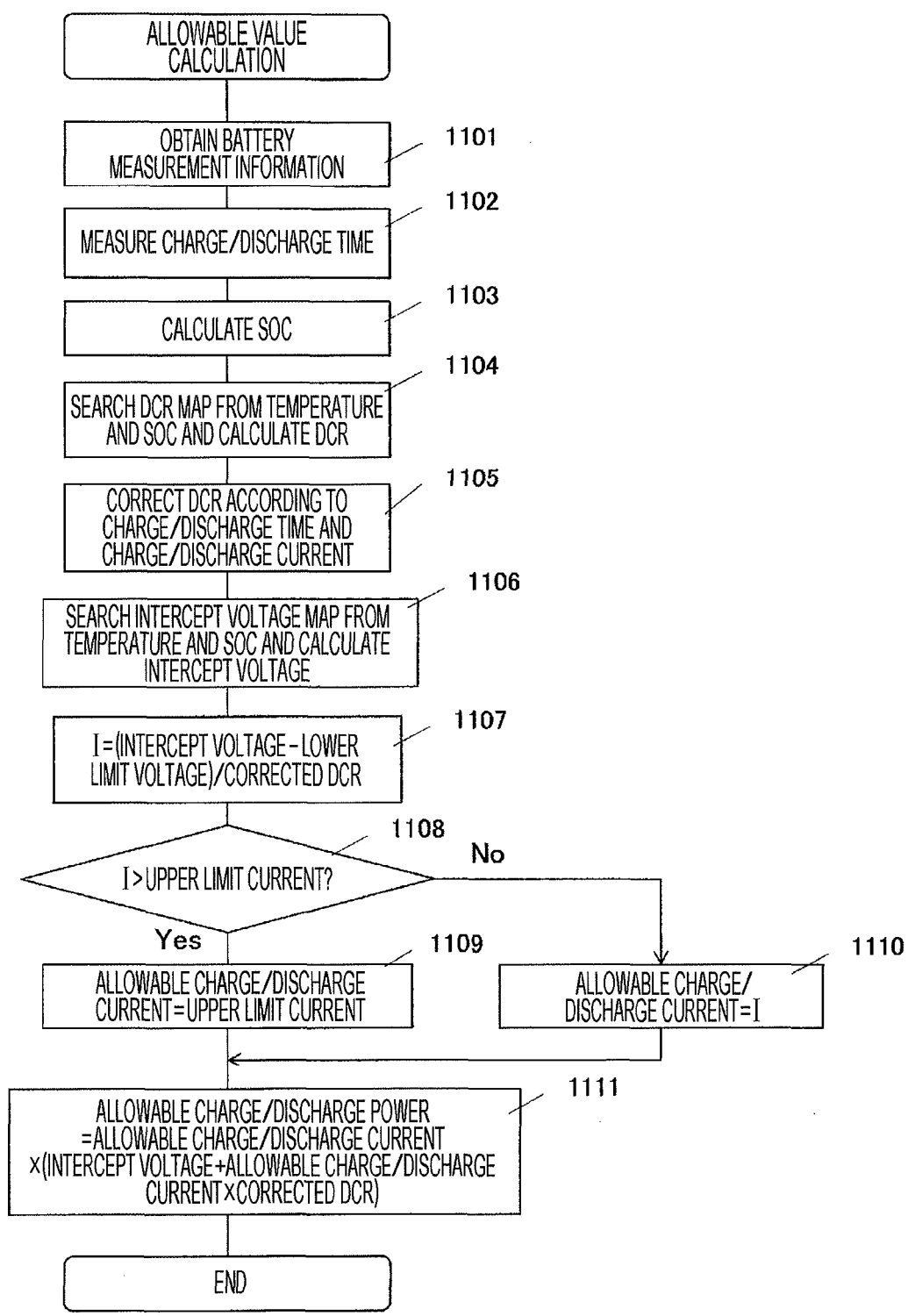
FIG. 7 is a flow chart showing a procedure of the allowable value calculation processing according to the charge/discharge control of the invention.

FIG. 7 is a flow chart showing a procedure of the allowable value calculation processing according to charge/discharge control of the present invention as described above. The assembled battery control section 150 executes the allowable value calculation processing in accordance with the flow chart.

In the assembled battery control section 150, in step 1101, the battery measurement information from the battery cell management section 120, the current detection section 130, and the voltage detection section 140 are obtained by the acquisition portion 150a. Namely, the acquisition portion 150a obtains the information on the battery voltage and the temperature from the battery cell management section 120, the information on the charge/discharge current from the current detection section 130, and the information on the total voltage from the voltage detection section 140 as the battery measurement information.

In the assembled battery control section 150, in step 1102, the charge/discharge time is measured by the time measurement portion 150b. When a battery is being charged, charge duration is measured as the charge/discharge time, and when the battery is being discharged, discharge duration is measured as the charge/discharge time.

In the assembled battery control section 150, the SOC is calculated by the SOC calculation portion 150c in step 1103. In this step, the charge/discharge current included in the battery measurement information obtained in step 1101 is integrated, whereby the variation of electric power stored in the assembled battery 110 is obtained. The SOC can be calculated by estimating a current storage power in the assembled battery 110, based on the variation of electric power thus obtained. The SOC may be calculated by a method other than this.

In the assembled battery control section 150, in step 1104, the internal resistance (DCR) is calculated by the internal resistance calculation portion 150d. In this step, referring to the DCR map stored in the storage section 180, a value of the internal resistance corresponding to the temperature obtained as the battery measurement information in step 1101 and the SOC calculated in step 1103 are searched from the DCR map. According to this constitution, the internal resistance corresponding to the characteristics of the assembled battery 110 can be accurately calculated from the temperature and the SOC.

In the assembled battery control section 150, in step 1105, the internal resistance (DCR) calculated in step 1104 is corrected by the correction portion 150e. In this step, based on the charge/discharge time measured in step 1102 and the charge/discharge current obtained as the battery measurement information in step 1101, a correction coefficient with respect to the internal resistance is determined. For example, the correction coefficient map reflecting the change of the battery voltage during charge and discharge as described in FIG. 4 is previously stored in the storage section 180, and the correction coefficient corresponding to the charge/discharge time and the charge/discharge current is determined by referring to the correction coefficient map. Then, the internal resistance calculated in step 1104 is multiplied by the correction coefficient, whereby the correction value of the internal resistance corresponding to the charge/discharge time and the charge/discharge current can be obtained. Alternatively, a function of the correction coefficient in which the charge/discharge time and the charge/discharge current are variables is defined based on the change of the battery voltage during charge/discharge as described in FIG. 4, and the correction coefficient is determined by using the function, whereby the internal resistance may be corrected.

The change of the battery voltage shown in the graph 42 of FIG. 4 is notably shown when the temperature of the battery is not less than a predetermined value. In light of this point, when the temperature obtained as the battery measurement information in step 1101 is less than the predetermined value, the processing in step 1105 is omitted, and the internal resistance may not be corrected.

In the assembled battery control section 150, in step 1106, the intercept voltage described in FIGS. 3(a) and 3(b) is calculated by the intercept voltage calculation portion 150f. In this step, referring to the intercept voltage map stored in the storage section 180, a value of the intercept voltage corresponding to the temperature obtained as the battery measurement information in step 1101 and the SOC calculated in step 1103 is searched from the intercept voltage map. According to this constitution, the intercept voltage corresponding to the characteristics of the assembled battery 110 can be accurately calculated from the temperature and the SOC. Alternatively, a function of the intercept voltage with the temperature and the SOC as variables is defined, and the intercept voltage may be calculated by using the function.

In the assembled battery control section 150, in step 1107, a candidate value I of the allowable charge/discharge current is calculated by the allowable value calculation portion 150g. In this step, the candidate value I of the allowable charge/discharge current is calculated by the following formula (1), using the value of the internal resistance corrected in step 1105, the value of the intercept voltage calculated in step 1106, and the lower limit voltage previously stored in the storage section 180. For example, in a lithium ion battery which can be used in the range of from 2.0 to 4.2 V, the lower limit voltage of 2.0 V is stored in the storage section 180.

$$I=\text{(intercept voltage}-\text{lower limit voltage)/internal resistance after correction} \qquad (1)$$

In the assembled battery control section 150, in step 1108, the allowable value calculation portion 150g determines whether or not the candidate value I of the allowable charge/discharge current calculated in step 1107 is more than a predetermined upper limit current. As the upper limit current, a value considering safety and the like during charge/discharge is previously stored in the storage section 180.

In step 1108, when it is determined that the candidate value I of the allowable charge/discharge current is more than the upper limit current, the assembled battery control section 150 sets the allowable charge/discharge current to the upper limit current in step 1109. Meanwhile, when it is determined that the candidate value I of the allowable charge/discharge current is not more than the upper limit current, the assembled battery control section 150 sets the candidate value I to the allowable charge/discharge current in step 1110. After step 1109 or 1110 is executed, the flow proceeds to step 1111.

In the assembled battery control section 150, in step 1111, the allowable charge/discharge power is calculated by the allowable value calculation portion 150g. In this step, the allowable charge/discharge power is calculated by the following formula (2), using the value of the internal resistance corrected in step 1105, the value of the intercept voltage calculated in step 1106, and the allowable charge/discharge current set in step 1109 or 1110.

Allowable charge/discharge power=allowable charge/
discharge current×(intercept voltage+allowable
charge/discharge current×internal resistance
after correction)     (2)

After execution of step 1111, the assembled battery control section 150 terminates the allowable value calculation processing according to the flow chart of FIG. 7. Then, each calculation result of the allowable charge/discharge current and the allowable charge/discharge power is transmitted to the battery cell management section 120 and the vehicle control section 200.

Subsequently, a method of confirming the allowable value calculation processing according to the present invention will be described. There is here described a method of confirming whether or not the allowable value calculation processing according to the invention is performed in the assembled battery control section 150, based on the allowable charge/discharge current and the allowable charge/discharge power transmitted from the assembled battery control section 150. In the following description, it is assumed that the assembled battery control section 150 is connected to a dedicated testing device, whereby the calculation result of the SOC can be obtained from the assembled battery control section 150 in addition to the allowable charge/discharge current and the allowable charge/discharge power.

A confirming person calculates the OCV and the internal resistance of the assembled battery 110 based on the calculation result of the SOC obtained from the assembled battery control section 150 and the contents of the above-described known OCV map and DCR map and calculates the allowable charge/discharge current or the allowable charge/discharge power. Then, those calculated values are compared with the value of the allowable charge/discharge current or the allowable charge/discharge power obtained from the assembled battery control section 150. As a result, if the both values do not coincide with each other, the allowable value calculation processing according to the present invention is executed in the assembled battery control section 150, and it can be judged that the intercept voltage may be used instead of the OCV. Since a different between the above values becomes particularly remarkable at low temperature, it is preferable to confirm at a predetermined temperature or less.

Further, the confirming person observes a state of the change of the value of the internal resistance calculated based on the calculation result of the SOC obtained from the assembled battery control section 150 when the assembled battery 110 is continuously charged and discharged. As a result, when the value of the internal resistance gradually increases with the passage of the charge/discharge time, the allowable value calculation processing according to the present invention is executed in the assembled battery control section 150, and it can be judged that the internal resistance may be corrected based on the charge/discharge time and the charge/discharge current. Since the change of the internal resistance is particularly remarkable when the charge/discharge current is large, it is preferable to confirm at a constant charge/discharge current or more.

According to the above-described embodiment, the following operational advantages are provided.

(1) The assembled battery control section 150 calculates the allowable current and the allowable power during charge/discharge of the assembled battery 110 from the no-load voltage and the internal resistance of the assembled battery 110. At this time, the no-load voltage and the internal resistance are corrected according to the situations of charge/discharge of the assembled battery 110. Thus, the current and the electric power allowed during charge/discharge can be accurately obtained.

(2) In the assembled battery control section 150, the temperature of the assembled battery 110 is obtained by the acquisition portion 150a (step 1101), and the SOC of the assembled battery 110 is calculated by the SOC calculation portion 150c (step 1103). Based on the temperature and the SOC, the intercept voltage calculation portion 150f calculates the intercept voltage caused when the charge/discharge current is 0 in the graph showing the relation between the charge/discharge current of the assembled battery 110 and the voltage of the assembled battery 110 (step 1106). The intercept voltage thus calculated is set to the no-load voltage used in the calculation of the allowable current and the allowable power during charge/discharge of the assembled battery 110 instead of the OCV, whereby the no-load voltage is corrected. Consequently, the no-load voltage can be correctly corrected while referring to the change of the intercept voltage during charge/discharge.

(3) The intercept voltage calculation portion 150f refers to the intercept voltage map previously stored in the storage section 180 and calculates the intercept voltage corresponding to the temperature obtained by the acquisition portion 150a and the SOC calculated by the SOC calculation portion 150c. Thus, the intercept voltage corresponding to the characteristics of the assembled battery 110 can be accurately calculated.

(4) In the assembled battery control section 150, the charge/discharge current of the assembled battery 110 is obtained by the acquisition portion 150a (step 1101), the charge/discharge time of the assembled battery 110 is measured by the time measurement portion 150b (step 1102), and the internal resistance of the assembled battery 110 is calculated by the internal resistance calculation portion 150d (step 1104). Then, the internal resistance is corrected by the correction portion 150e, based on the charge/discharge time and the charge/discharge current (step 1105). Thus, the internal resistance can be correctly corrected while referring to the change of the internal resistance during charge/discharge.

(5) In the correction portion 150e, when the temperature obtained by the acquisition portion 150a is less than a predetermined value, the internal resistance may not be corrected. Thus, unnecessary processing can be omitted in such a temperature range that the change of the internal resistance does not appear during charge/discharge.

(6) The correction portion 150e refers to the correction coefficient map previously stored in the storage section 180 and can obtain the correction value of the internal resistance corresponding to the charge/discharge time and the charge/discharge current. Thus, the internal resistance can be accurately corrected according to the characteristics of the assembled battery 110.

The present invention is not limited to the above embodiment, and various design changes and modifications can be made without departing from the gist of the invention. For example, in the above embodiment, although there has been described an example in which the internal resistance and the intercept voltage of the assembled battery 110 and the correction coefficient of the internal resistance are calculated by referring to various map information, the map information is not necessarily referred in those calculation.

In the above embodiment, any one of the calculation of the allowable charge/discharge current and the calculation of the allowable charge/discharge power may be omitted. In addition, any one of the calculation of the intercept voltage performed by the intercept voltage calculation portion 150*f* and the correction of the internal resistance performed by the correction portion 150*e* may be omitted. When the calculation of the intercept voltage is omitted, the OCV is calculated instead of the intercept voltage, and the allowable charge/discharge current and the allowable charge/discharge power may be calculated using the calculated OCV. Namely, the present invention can be applied to a battery control device which calculates at least one of the allowable current and the allowable power during charge/discharge of a battery from the no-load voltage and the internal resistance, and according to the invention, at least one of the no-load voltage and the internal resistance is corrected according to the situations of charge/discharge of the battery.

The above-described various variations may be adopted singly or in any combination.

The above-described embodiment and various variations are just examples, and the present invention is not limited to their contents unless the features of the invention are impaired.

The invention claimed is:

1. A battery control device comprising:
    a temperature acquisition portion which obtains a temperature of the battery;
    a State of Change (SOC) calculation portion which calculates SOC of the battery;
    an internal resistance calculation portion which calculates an internal resistance of the battery;
    an intercept voltage calculation portion which calculates, based on the temperature obtained by the temperature acquisition portion and the SOC calculated by the SOC calculation portion, an intercept voltage which corresponds to an intercept to a voltage axis of a graph linearly representing a relation between current and voltage during charge/discharge of the battery, and is decreased by as much as the temperature and the SOC of an open voltage of the battery; and
    an allowable value calculation portion which calculates at least one of allowable current and allowable power during charge/discharge of the battery, based on the intercept voltage calculated by the intercept voltage calculation portion and the internal resistance calculated by the internal resistance calculation portion.

2. The battery control device according to claim 1, wherein the intercept voltage calculation portion refers to previously stored map information and calculates the intercept voltage corresponding to the temperature and the SOC.

3. The battery control device according to claim 2, further comprising:
    a current acquisition portion which obtains a charge/discharge current of the battery;
    a time measurement portion which measures a charge/discharge time of the battery;
    an internal resistance calculation portion which calculates the internal resistance of the battery; and
    a correction portion which corrects the internal resistance, calculated by the internal resistance calculation portion, based on the charge/discharge time measured by the time measurement portion and the charge/discharge current obtained by the current acquisition portion.

4. The battery control device according to claim 3, further comprising a temperature acquisition portion which obtains a temperature of the battery,
    wherein the correction portion does not correct the internal resistance when the temperature obtained by the temperature acquisition portion is less than a predetermined value.

5. The battery control device according to claim 3, wherein the correction portion refers to the previously stored map information and obtains a correction value of the internal resistance corresponding to the charge/discharge time and the charge/discharge current.

6. The battery control device according to claim 1, further comprising:
    a current acquisition portion which determines a charge/discharge current of the battery;
    a time measurement portion which measures a charge/discharge time of the battery; and
    a correction portion which determines a correction coefficient to the internal resistance based on the charge/discharge time measured by the time measurement portion and the charge/discharge current obtained by the current acquisition portion and corrects the internal resistance calculated by the internal resistance calculation portion, using the correction coefficient,
    wherein the allowable value calculation portion calculates at least one of the allowable current and the allowable power based on the intercept voltage calculated by the intercept voltage calculation portion and the internal resistance calculated by the internal resistance calculation portion and corrected by the correction portion.

7. The battery control device according to claim 6, further comprising a temperature acquisition portion which obtains a temperature of the battery,
    wherein the correction portion does not correct the internal resistance when the temperature obtained by the temperature acquisition portion is less than a predetermined value.

8. The battery control device according to claim 6, wherein the correction portion refers to previously stored map information and determines the correction coefficient corresponding to the charge/discharge time and the charge/discharge current.

* * * * *